(12) United States Patent
Sudo et al.

(10) Patent No.: US 9,133,063 B2
(45) Date of Patent: Sep. 15, 2015

(54) COMPOSITE CRUCIBLE, METHOD OF MANUFACTURING THE SAME, AND METHOD OF MANUFACTURING SILICON CRYSTAL

(75) Inventors: Toshiaki Sudo, Akita (JP); Takuma Yoshioka, Akita (JP); Hiroshi Kishi, Akita (JP); Takeshi Fujita, Akita (JP); Minoru Kanda, Akita (JP); Koichi Suzuki, Akita (JP); Ken Kitahara, Akita (JP)

(73) Assignee: SUMCO CORPORATION, Tokyo (JP)

( * ) Notice: Subject to any disclaimer, the term of this patent is extended or adjusted under 35 U.S.C. 154(b) by 106 days.

(21) Appl. No.: 13/394,268

(22) PCT Filed: Aug. 20, 2010

(86) PCT No.: PCT/JP2010/064056
§ 371 (c)(1),
(2), (4) Date: Mar. 5, 2012

(87) PCT Pub. No.: WO2011/030658
PCT Pub. Date: Mar. 17, 2011

(65) Prior Publication Data
US 2012/0160155 A1    Jun. 28, 2012

(30) Foreign Application Priority Data

Sep. 9, 2009  (JP) ................... 2009-208606

(51) Int. Cl.
*C30B 15/10* (2006.01)
*C03B 19/02* (2006.01)
(Continued)

(52) U.S. Cl.
CPC ........... *C04B 41/5022* (2013.01); *C03B 19/095* (2013.01); *C04B 35/185* (2013.01);
(Continued)

(58) Field of Classification Search
CPC ...... C30B 15/10; C30B 29/06; C30B 35/002; C03B 19/095; C04B 35/185; C04B 41/009; C04B 41/5022; C04B 41/86
USPC ........................... 117/13, 208; 65/17.6, 60.53
See application file for complete search history.

(56) References Cited

U.S. PATENT DOCUMENTS 4,431,420 A  *  2/1984 Adair ............................. 106/35
5,980,629 A     11/1999 Hansen et al.
(Continued)

FOREIGN PATENT DOCUMENTS

EP          0753605 A1    1/1997
JP          63-011576 A   1/1988
(Continued)

OTHER PUBLICATIONS

International Search Report for PCT/JP2010/064056; mailed Nov. 9, 2010.
(Continued)

*Primary Examiner* — Michael Kornakov
*Assistant Examiner* — Hua Qi
(74) *Attorney, Agent, or Firm* — Law Office of Katsuhiro Arai (57) ABSTRACT

The purpose of the present invention is to provide a crucible which has high viscosity at high temperature, and can be used for a long time, and can be manufactured at low cost, and a method of manufacturing the same. The composite crucible 10 is characterized in the use of mullite ($3Al_2O_3 \cdot 2SiO_2$) as the basic material of the crucible. The composite crucible 10 has the crucible body 11 made of mullite material whose main component is alumina and silica, and a transparent vitreous silica layer 12 formed on the inner surface of the crucible body 11. The thickness of the transparent vitreous silica layer 12 is smaller than that of the crucible body 11. The crucible body 11 can be formed by the slip casting method, and the transparent vitreous silica layer 12 can be formed by the thermal spraying method.

2 Claims, 9 Drawing Sheets

(51) Int. Cl.

| | |
|---|---|
| *C03B 20/00* | (2006.01) |
| *C04B 41/50* | (2006.01) |
| *C03B 19/09* | (2006.01) |
| *C04B 35/185* | (2006.01) |
| *C04B 41/00* | (2006.01) |
| *C04B 41/86* | (2006.01) |
| *C30B 29/06* | (2006.01) |
| *C30B 35/00* | (2006.01) |

(52) U.S. Cl.
 CPC ............... *C04B41/009* (2013.01); *C04B 41/86* (2013.01); *C30B 15/10* (2013.01); *C30B 29/06* (2013.01); *C30B 35/002* (2013.01); *C04B 2235/6027* (2013.01); *Y10T 117/1032* (2015.01)

(56) References Cited

U.S. PATENT DOCUMENTS

| | | | |
|---|---|---|---|
| 6,524,668 | B1 | 2/2003 | Tsuji et al. |
| 6,553,787 | B1 * | 4/2003 | Akiho et al. .................. 65/17.3 |
| 2003/0113449 | A1 * | 6/2003 | Tsuji et al. .................... 427/231 |
| 2004/0115440 | A1 * | 6/2004 | Werdecker et al. ........... 428/426 |
| 2005/0233084 | A1 * | 10/2005 | Marty et al. ............... 427/372.2 |
| 2006/0016389 | A1 | 1/2006 | Holder et al. |
| 2006/0144327 | A1 | 7/2006 | Ohama et al. |
| 2006/0236916 | A1 | 10/2006 | Ohama et al. |
| 2009/0155158 | A1 * | 6/2009 | Ito et al. ....................... 423/349 |
| 2010/0319608 | A1 * | 12/2010 | Kanda ............................. 117/13 |

FOREIGN PATENT DOCUMENTS

| | | | | | |
|---|---|---|---|---|---|
| JP | 03-295850 | A | 12/1991 | | |
| JP | 2000-007487 | A | 1/2000 | | |
| JP | 2000-247778 | A | 9/2000 | | |
| JP | 2000247778 | A * | 9/2000 | ............ | C30B 15/10 |
| JP | 2002-160997 | A | 6/2002 | | |
| JP | 2004-531449 | A | 10/2004 | | |
| JP | 2008-507467 | A | 3/2008 | | |
| JP | 2009-018958 | A | 1/2009 | | |
| JP | 2009-051729 | A | 3/2009 | | |
| WO | 2004/106247 | A1 | 12/2004 | | |
| WO | WO 2009041684 | A1 * | 4/2009 | ............ | C30B 15/10 |

OTHER PUBLICATIONS

Ilhan A. Aksay, Daniel M. Dabbs, and Mehmet Sarikaya, "Mullite for Structural, Electronic, and Optical Applications," Journal of American Ceramic Society, Oct. 1991, vol. 74, No. 10, pp. 2343-2358.

Taiwan Search Report (TWSR) issued on Jul. 3, 2013, by Taiwan Intellectual Property Office (TIPO), for Taiwan counterpart application No. 099130207.

Taiwan Office Action issued Jul. 3, 2013, by Taiwan Intellectual Property Office (TIPO), for Taiwan counterpart application No. 099130207.

Extended European Search Report (EESR) mailed on Dec. 6, 2012, by European Patent Office (EPO), for counterpart application No. 10815255.4.

* cited by examiner

COMPOSITE CRUCIBLE, METHOD OF MANUFACTURING THE SAME, AND METHOD OF MANUFACTURING SILICON CRYSTAL

TECHNICAL FIELD

The present invention relates to a composite crucible and a method of manufacturing the same, and the present invention relates to a method of manufacturing a silicon crystal by use of the composite crucible.

BACKGROUND ART

Nowadays, the demand for a solar cell has been increasing in consideration of environment problem and energy problem. The solar cell can be generally classified into "bulk-type" and "thin film-type" according to the configuration. The bulk-type solar cell is made of a wafer obtained by slicing a silicon ingot by a predetermined thickness, and has high conversion efficiency, but the price is high and susceptible to the influence of the material silicon price. On the other hand, there are known thin film-type solar cells such as a "silicon-based thin film solar cell" obtained by forming a thin film of amorphous silicon or polysilicon on a substrate such a glass substrate, a "compound-based thin film solar cell" which is a kind of compound semiconductor and made of copper, indium, selenium, gallium and the like, and an "organic thin film solar cell" to produce photovoltaic power by use of an organic dye. For example, the amount of material silicon used in the thin film-based solar cell is $1/100$ or less, and energy required for the manufacturing is less, and thus nowadays the thin film solar cell is drawing attention.

Furthermore, the solar cell is generally classified into a "silicon-based solar cell" and a "compound semiconductor solar cell", based on the kind of the semiconductor used for the power generation part. Furthermore, the silicon-based solar cell is classified into a crystalline silicon-based solar cell and an amorphous silicon solar cell. The crystalline silicon-based solar cell is classified into a monocrystalline silicon-based solar cell and a polycrystalline silicon-based solar cell.

Regarding conversion efficiency which is the most important aspect for a solar cell, nowadays, the compound semiconductor-based solar cell has reached nearly 25%, which is the highest, and the monocrystalline silicon-based solar cell is about 20%, and the polycrystalline silicon-based solar cell and the amorphous silicon-based solar cell are about 5 to 15%. Regarding the raw material cost, silicon is an element which is the second most abundant on the earth (oxygen is the most abundant), and thus much cheaper than compound semiconductor, and thus silicon-based solar cell is most widely used. The "conversion efficiency" refers to a ratio of the energy converted to electrical energy by the solar cell with respect to the energy of the incoming light into the solar cell. The ratio is represented by "percentage (%)".

Next, a method of manufacturing a monocrystalline silicon solar cell will be explained briefly. First, a cylindrical silicon single crystal ingot is manufactured by the Czochralski method (the CZ method) or the floating zone melting method (the FZ method) to obtain a silicon wafer which is a substrate of a solar cell. For example, in the CZ method, polycrystalline silicon is supplied into a vitreous silica crucible, followed by melting by heating. Then, a seed crystal is dipped into the obtained silicon melt, and gradually pulled up, to produce a silicon single crystal.

Then, the ingot is sliced to obtain thin wafers each having a thickness of, for example, 300 μm. The surface of the obtained wafer is etched by a chemical to remove processing strain in the surface, to obtain a wafer (substrate) for a solar cell. An impurity (dopant) is diffused into the wafer to form a PN junction on one side of the wafer, and then electrodes are formed on both sides, and thereafter an antireflection film is formed on the sunlight incidence plane to reduce light energy loss due to light reflection, to obtain the solar cell. In the solar cell, in order to increase the current, it is important to manufacture a solar cell having a larger area. The CZ method is excellent in that it allows easy production of a silicon single crystal having a large diameter, and the obtained single crystal is excellent in the strength. Therefore, this method is preferred as a method of obtaining a silicon wafer, having a large diameter, which is a substrate material for manufacturing a large-area solar cell.

On the other hand, in the manufacturing of the polycrystalline silicon-based solar cell, it is preferred to use the casting method where silicon melt is solidified in the mold, or the electromagnetic casting method which is a continuous casting method by electromagnetic induction. By use of such methods, it is possible to manufacture a substrate material at lower cost than a single crystal silicon substrate, which is manufactured by the CZ method. In the casting method, high-purity silicon is heated and melted in a crucible, and a small amount of boron (which is a dopant) and the like is uniformly added thereto, and the silicon melt is solidified therein or solidified after the silicon melt is introduced into a mold. It is required that the crucible and the mold used for the casting method are excellent in heat resistance and shape stability, and in addition, low impurity content is also demanded. So, the crucible is made of silica, and the mold is made of graphite.

The vitreous silica crucible used for manufacturing a silicon crystal is required to have high viscosity at high temperature in order to be durable enough for long-time and multiple pulling or casting. When a silicon single crystal having a large diameter of 300 mm or more is manufactured by the CZ method, a vitreous silica crucible is exposed to a high temperature of about 1500 degrees C. for 300 to 400 hours. It is required that the deformation of the vitreous silica crucible is small even under such conditions. Furthermore, the vitreous silica crucible is disposable, and thus it is demanded to manufacture the vitreous silica crucible easily and at low cost. As a conventional crucible having high strength at high temperature, there is known a crucible having a layer containing aluminium (Al) in high concentration on the outer surface side, a crucible obtained by coating a crystallization promoter (e.g. barium (Ba)) on the outer surface, and a crucible having, on the outer surface, a stabilization layer made of alumina, mullite, or the like (See Patent Documents 1 to 3).

PRIOR ART REFERENCE

Patent Document

Patent Document 1: JP-A-2000-247778
Patent Document 2: JP-A-2008-507467
Patent Document 3: JP-A-2004-531449

SUMMARY OF THE INVENTION

Problems to be Solved by the Inventions

However, for example, the conventional vitreous silica crucible where the aluminium concentration in the vitreous silica is increased has relatively high viscosity, but the high temperature strength is not sufficient for multiple pulling. Furthermore, the conventional vitreous silica where barium is coated on the surface as a crystallization promoter can be strengthened by the crystallization of the crucible surface, but the coating is laborious, and handling of toxic barium is also problematic. Furthermore, in the conventional vitreous silica crucible where a stabilization layer is formed on the outer surface, the stabilization layer is formed by the thermal spraying method in a thickness of approx. 1 mm, and this enhances the high temperature strength of the entire crucible. However, the crucible is strengthened only by a thin layer, and thus it is required to further strengthen the crucible.

Thus, the purpose of the present invention is to provide a crucible which has high viscosity at high temperature, and can be used for a long time, and can be manufactured at low cost, and a method of manufacturing the same. Furthermore, another purpose of the present invention is to provide a method of manufacturing a silicon crystal by use of such a crucible.

Means for Solving the Problems

In order to solve the above-mentioned problem, the present invention provides a composite crucible for supporting silicon melt and having a straight body portion and a bottom portion, wherein the composite crucible having a crucible body made of mullite material whose main component is alumina and silica, and a transparent vitreous silica layer formed on an inner surface side of the crucible body and having a thickness smaller than the crucible body.

According to the present invention, because the material for the crucible body is mullite material, and thus the high temperature strength can be enhanced. Therefore, it is possible to provide a crucible which is made of a material different from vitreous silica and which can be used for a long time and can be manufactured at low cost. Whether the material for the crucible body is mullite material or not can be determined, for example, based on whether there are peaks of the diffraction strength originated from mullite and other main peaks in the X-ray diffraction. When peaks originated from mullite appear in addition to peaks originated from other compounds, it can be determined that the material is mullite.

In the present invention, it is preferred that the thickness of the crucible body is 5 mm or more, and the thickness of the transparent vitreous silica layer is 0.5 mm or more. The mullite material crucible having sufficient thickness is the basic structure, and the inner surface is covered with a transparent vitreous silica layer. Therefore, the high temperature strength of the crucible is enhanced, and the impurity contamination of the silicon melt in the crucible can be prevented.

In the present invention, it is preferred that the aluminium concentration in the crucible body has a gradient lowering from the outer surface side to the inner surface side of the crucible body. According to this configuration, the viscosity on the outer surface side of the crucible body can be sufficiently enhanced, and the thermal expansion coefficient of the inner surface side of the crucible body is close to that of vitreous silica, and thus they are strongly united. Furthermore, impurity contamination of silicon melt in the crucible can be prevented.

It is preferred that the composite crucible of the present invention further includes an opaque vitreous silica layer containing numerous microbubbles and provided between the crucible body and the transparent vitreous silica layer. According to this configuration, cracks and detachment due to difference in thermal expansion coefficient between the crucible body and the transparent vitreous silica layer can be prevented.

The method of manufacturing a composite crucible of the present invention includes a process of forming, by the slip casting method, a crucible body having a straight body portion and a bottom portion and made of mullite material whose main component is alumina and silica, and a process of forming a transparent vitreous silica layer on the inner surface side of the crucible body.

Furthermore, the method of manufacturing a composite crucible of the present invention includes a process of forming, by the arc fusing method, a crucible body having a straight body portion and a bottom portion and made of mullite material whose main component is alumina and silica, and a process of forming a transparent vitreous silica layer on the inner surface side of the crucible body.

In the present invention, the transparent vitreous silica layer can be formed by the thermal spraying method, by the arc fusing method, or by insertion of pre-formed transparent vitreous silica molded body. When the transparent vitreous silica layer is formed by the insertion, it is preferred that the inner surface of the crucible body is roughened by etching or sandblast process, and thereafter, the transparent vitreous silica molded body is inserted into the crucible body, and then the transparent vitreous silica crucible molded body is heated to be fused with the crucible body. In any case, the transparent vitreous silica layer can be easily formed.

In the method of manufacturing a composite crucible of the present invention, it is preferred that an opaque vitreous silica layer containing numerous microbubbles is formed between the crucible body made of mullite material and the transparent vitreous silica layer. In this case, the opaque vitreous silica layer and the transparent vitreous silica layer are formed in this order on the inner surface of the crucible body. The opaque vitreous silica layer can be formed by the thermal spraying method, or can be formed by the arc fusing method simultaneously with the transparent vitreous silica layer, or can be formed by insertion of a vitreous silica molded body having two layer structure of the opaque vitreous silica layer on the outer surface side and the transparent vitreous silica layer on the inner surface side. In any case, the opaque vitreous silica layer can be easily formed between the crucible body and the transparent vitreous silica layer.

Furthermore, the method of manufacturing a silicon crystal of the present invention is a method of manufacturing a silicon crystal by contacting a seed crystal to silicon melt in the composite crucible, and gradually pulling the seed crystal to grow a silicon crystal, wherein the composite crucible has a straight body portion and a bottom portion, and has a crucible body made of mullite material whose main component is alumina and silica, and a transparent vitreous silica layer formed on an inner surface of the crucible body, and the thickness of the transparent vitreous silica layer is smaller than that of the crucible body.

Effect of the Invention

Thus, according to the present invention, it is possible to provide a crucible which is made of a material different from vitreous silica and which can be used for a long time because of its high temperature strength and can be manufactured at low cost, and provide a method of manufacturing the same.

Because the composite crucible of the present invention can be used for a long time and manufactured at low cost, the crucible is appropriate for manufacturing silicon material for a solar cell. Furthermore, according to the present invention, there is provided a method of manufacturing a silicon crystal by use of such a crucible.

DESCRIPTION OF THE EMBODIMENTS

Hereinafter, with reference to the attached drawings, preferred embodiments of the present invention will be explained.

Figure 1:
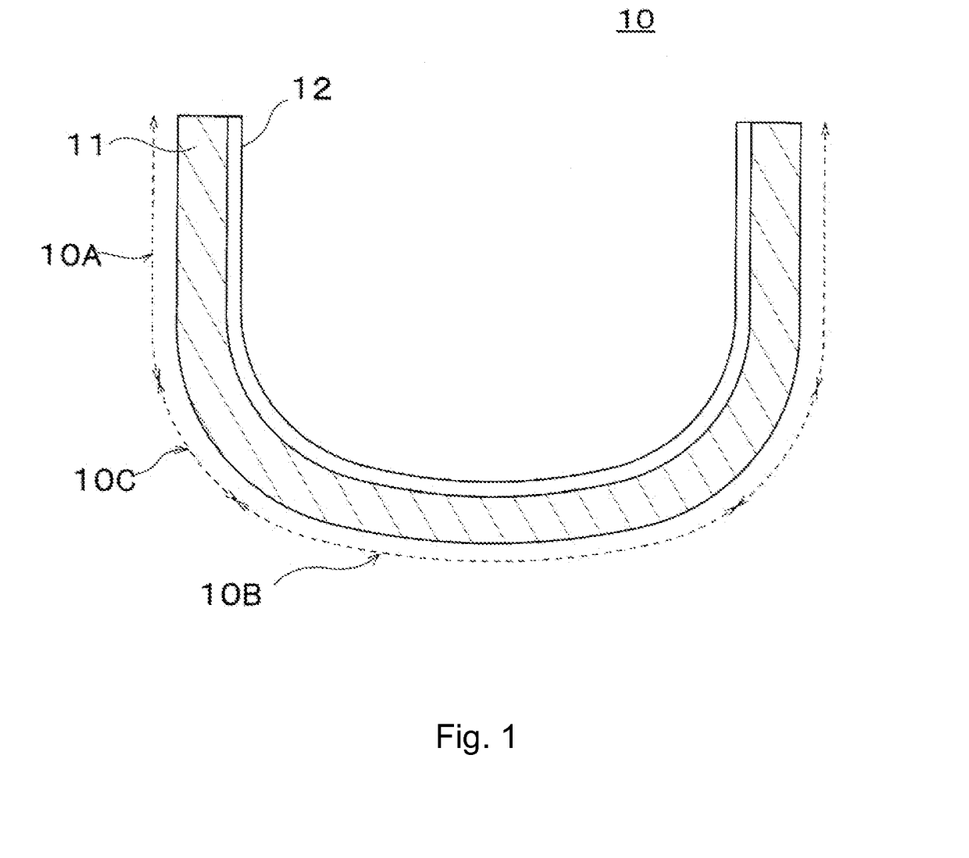
FIG. 1 is a sectional view schematically showing the structure of a composite crucible of a preferred embodiment of the present invention.

FIG. 1 is a schematic sectional view showing the structure of a composite crucible according to a preferred embodiment of the present invention.

As shown in FIG. 1, the composite crucible 10 of the present embodiment is characterized in the use of mullite ($3Al_2O_3 \cdot 2SiO_2$) as the basic material of the crucible. Therefore, the composite crucible 10 has the crucible body 11 made of mullite material whose main component is alumina and silica, and a transparent vitreous silica layer 12 formed on the inner surface of the crucible body 11. A "composite crucible" means that the basic material for the crucible is not only vitreous silica as in a conventional crucible, but the material for the crucible is mullite and vitreous silica, thus composite. The name of "composite crucible" should not limit the scope of the present invention.

The crucible body 11 is the basic structure of the crucible, and is provided on the outer surface side of the crucible. In other words, the composite crucible of the present embodiment is two-layered structure having a mullite material layer provided on the outer surface side of the crucible and a transparent vitreous silica layer 12 provided on the inner surface side. Mullite is a compound containing aluminum oxide ($Al_2O_3$) and silicon dioxide ($SiO_2$) in a ratio of 3:2, and the melting point is 1850 degrees C. Therefore, the mullite has high temperature strength larger than vitreous silica. Because mullite has larger viscosity at high temperature compared with vitreous silica, the use of mullite enhances the high temperature strength of the entire crucible. Furthermore, mullite is cheaper than vitreous silica, and thus the use of mullite is advantageous in terms of cost.

In the present specification, "mullite material" not only includes high-purity material only containing mullite, but also includes material dispersing alumina or silica in the mullite matrix. In this case, the mullite material is preferred to include mullite in an amount of at least 50%, preferably at least 80%. When the ratio of mullite is 50% or less, the nature of alumina or silica is dominant rather than mullite, and thus mullite does not exhibit its nature.

The thermal expansion coefficient of mullite can vary dependent on the ratio of $SiO_2$ and $Al_2O_3$, but is known as 4.3 to 4.9 ($10^{-6}K^{-1}$). In contrast, the thermal expansion coefficient of $Al_2O_3$ is 7.8 and the thermal expansion coefficient of vitreous silica is 0.56. Although the thermal expansion coefficient of mullite is larger than vitreous silica, they can be readily joined. Therefore, it is possible to prevent detachment, due to difference in the thermal expansion coefficient, between the crucible body 11 and the transparent vitreous silica layer 12 by properly controlling the temperature during heating and cooling. Furthermore, it is possible to prevent the detachment by forming the below-mentioned aluminium concentration gradient or an opaque vitreous silica layer 13 containing bubbles.

Figure 2:
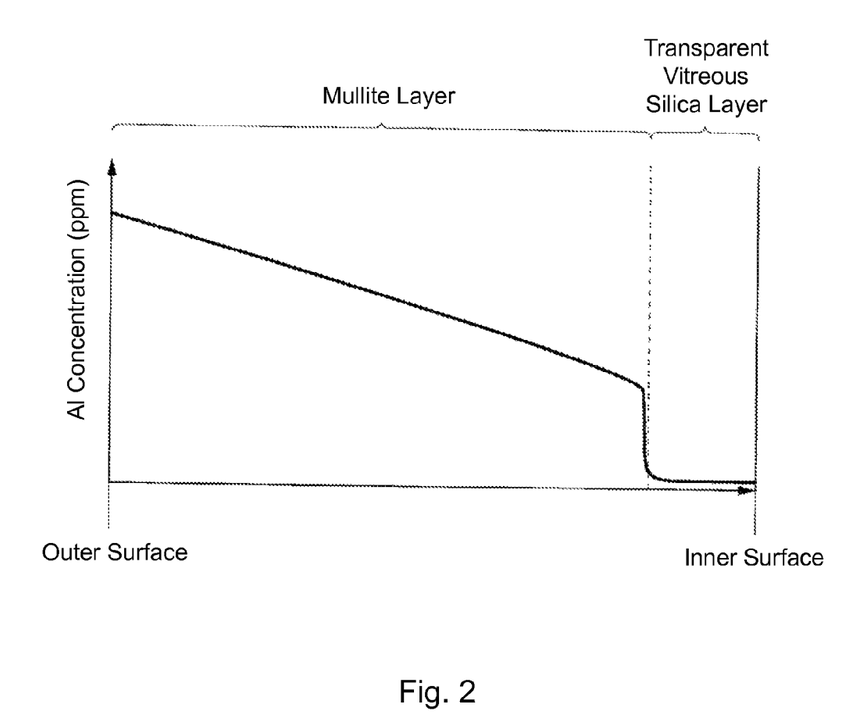
FIG. 2 is a graph showing Al concentration distribution with respect to the thickness direction of the composite crucible.

FIG. 2 is a gradually showing the Al concentration change with respect to the thickness direction of the crucible body 11.

As shown in FIG. 2, the aluminium concentration contained in the crucible body 11 made of mullite material may have concentration gradient which lowers from the outer surface to the inner surface. In this case, the aluminium concentration at the region near the outer surface of the crucible body 11 is the aluminium concentration in mullite, and the aluminium concentration gradually lowers toward the inner surface side, and the aluminium concentration at the region near the inner surface of the crucible body 11 is several ppm. In such configuration, the thermal expansion coefficient of the inner surface side of the crucible body 11 is close to that of vitreous silica, and thus delamination due to the difference in thermal expansion coefficient can be prevented, and they can be strongly united. Furthermore, because the aluminium concentration on the crucible inner surface side is low, and thus it is possible to prevent aluminium contamination of silicon melt in the crucible.

The crucible body 11 is preferred to contain each of alkali metals (Na, K and Li) in an amount of 0.05 ppm or less. This is because, when the crucible body 11 contains a large amount of alkali metals, the amount of impurities released into silicon melt from the crucible can increase, and the quality of a silicon single crystal can deteriorate. A crucible used for pulling a silicon single crystal for a semiconductor device needs to meet the aforementioned conditions. However, a crucible used for pulling a single crystal for a solar cell may contain a relatively large amount of alkali metals.

The transparent vitreous silica layer 12 is an amorphous vitreous silica layer substantially not containing bubbles. The transparent vitreous silica layer 12 prevents the increase of vitreous silica pieces detached from the crucible inner surface, and thus enhances silicon single crystallization yield. Here, "substantially not containing bubbles" refer to a state that the bubble content rate and the bubble size are such that the single crystallization yield is not deteriorated due to the bubbles. Although not in particular limited, "substantially not containing bubbles" refer to a state that the bubble content rate is 0.1% or less and the average diameter of the bubbles is 100 µm or less. The bubble content rate of the transparent vitreous silica layer can be measured nondestructively by use of an optical detection unit. As the optical detection unit, an optical camera having a light-receiving lens and an image pickup unit can be employed. In order to measure the bubble content rate from the surface to a certain depth, the focus of the light-receiving lens is scanned from the surface to the depth. The obtained image data is processed in an image processing device to calculate the bubble content rate. Such nondestructive method of measuring a bubble content rate is detailed in, for example, JP-A-Hei3-86249.

The transparent vitreous silica layer 12 may be made of natural vitreous silica or synthetic vitreous silica. Natural vitreous silica is vitreous silica manufactured from natural silica such as silica stone, natural quartz crystal. In general, natural silica contains metal impurities in higher concentration and OH group in lower concentration than synthetic silica. For example, for natural silica, the Al content is 1 ppm or more, and the content of each element of alkali metals (Na, K and Li) is 0.05 ppm or more, and the OH group content is less than 60 ppm. Natural silica has larger viscosity at high temperature than synthetic silica, and thus enhances the high temperature strength of the whole crucible. In addition, natural silica is cheaper than synthetic silica, and thus the use of natural silica is advantageous in terms of cost.

On the other hand, synthetic vitreous silica is vitreous silica manufactured from synthetic silica obtained, for example, by hydrolysis of silicon alkoxide. In general, synthetic silica contains metal impurities in lower concentration and OH group in higher concentration than natural silica. For example, for synthetic silica, the content of each element of metal impurities is less than 0.05 ppm, and the OH group content is 30 ppm or more. However, synthetic silica containing metal impurities such as Al is also known. Thus, whether silica is synthetic or not should not be determined based on a single factor, but should be determined based on plural factors. Synthetic vitreous silica contains impurities in much lower concentration than natural vitreous silica, and thus prevents the increase of impurities released into silicon melt from the crucible, and thus enhances silicon single crystallization yield.

The crucible body 11 and the transparent vitreous silica layer 12 are disposed on the entire crucible from the straight body portion 10A to the bottom portion 10B. The straight body portion 10A is cylindrical, and extends downward from the crucible opening. However, the straight body portion 10A does not need to be perfectly parallel with respect to the crucible central axis (Z axis), and may be tilted so that the straight body portion 10A is widened toward the opening. Furthermore, the straight body portion 10A may be linear or gradually curved.

The bottom portion 10B of the crucible is a substantially disk-shaped portion containing a point of intersection with Z axis of the crucible. A curved portion 10C is provided between the bottom portion 10B and the straight body portion 10A. The shape of the bottom portion 10B may have a rounded or flat bottom. The curvature and angle of the curved portion 10C may be set discretionarily. When the crucible bottom portion 10B has a rounded bottom, the bottom portion also has a certain curvature, and thus the difference in curvature between the bottom portion 10B and the curved portion 10C is much smaller compared with the case when the bottom portion 10B has a flat bottom. When the bottom portion 10B has a flat bottom, the bottom portion 10B has a flat or extremely gradually curved surface, and the curvature of the curved portion 10C is very large.

The thickness of the crucible body 11 is preferred to be 5 mm or more, and more preferred to be 5 mm or more and 20 mm or less. Usually, the wall thickness of a small-size, middle-size, or large-size crucible having an opening diameter of 16 inches (about 400 mm) is 5 mm or more, and such crucibles are preferably used for long-term manufacturing, and the effect of the present invention is eminent in such crucibles. Furthermore, because the thickness of the crucible body 11 is 5 mm or more, the crucible body 11 is clearly distinguishable from a conventional stabilization layer (See Patent Document 3). The thickness of the crucible body 11 can vary depending on the crucible size, but when the thickness of the crucible body 11 is about 20 mm or more, it can be configured as a large crucible having an opening diameter of 40 inches (about 1000 mm).

In contrast, the thickness of the transparent vitreous silica layer 12 is preferred to be 0.5 mm or more, and more preferred to be 0.5 mm or more and 2.0 mm or less. When the transparent vitreous silica layer 12 is thinner than 0.5 mm, it may occur that the transparent vitreous silica layer 12 is totally corroded and the crucible body 11 is exposed during pulling a silicon single crystal. The thickness of the transparent vitreous silica layer 12 does not need to be constant from the straight body portion 10A to the bottom portion 10B, and for example, the thickness of the transparent vitreous silica layer 12 may be thicker at the curved portion 10C than that at the straight body portion 10A and the bottom portion 10B.

The composite crucible of the present invention has mullite material as the basic material for the crucible body, and thus is better in that durability at high temperature than the conventional vitreous silica crucible. In particular, the basic durability of the crucible body itself is higher than that of a reinforced crucible having a crystallization promoter applied to the surface of vitreous silica or having a thin stabilization layer formed on the surface of vitreous silica. Therefore, it becomes possible to pull multiple silicon single crystals from a single crucible by the multiple pulling (multi-pulling) method in which silicon material is re-charged. This leads to large reduction of the manufacturing cost of a silicon single crystal.

The composite crucible using mullite has higher impurity concentration (in particular Al concentration) compared with a vitreous silica crucible, and thus such crucible is not necessarily appropriate for pulling a silicon single crystal for a semiconductor device. However, because the inner surface, contacting silicon melt, of the composite crucible is covered with a transparent vitreous silica layer, and thus dissolution of impurities into silicon melt can be prevented to some extent, the composite crucible is appropriate for pulling a silicon crystal for use having looser tolerance against impurities, such as a solar cell. Furthermore, mullite is cheaper than silica material, and thus the composite crucible is advantageous in terms of cost, and thus enables production of a cheaper silicon wafer.

Figure 3:
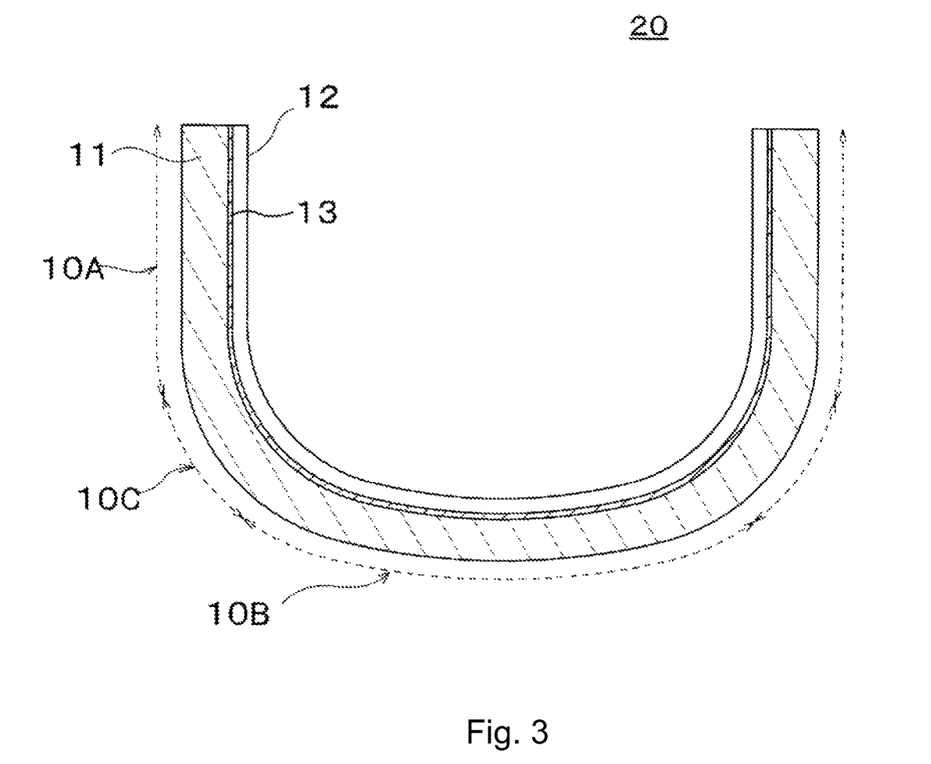
FIG. 3 is a sectional view schematically showing the structure of the composite crucible of another preferred embodiment of the present invention.

FIG. 3 is a sectional view schematically showing the structure of the composite crucible according to another preferred embodiment of the present invention.

As shown in FIG. 3, this composite crucible 20 includes an opaque vitreous silica layer 13 provided between the crucible body 11 made of mullite material and the transparent vitreous silica layer 12. The opaque vitreous silica layer 13 is an amorphous vitreous silica layer incorporating numerous microbubbles. In the present specification, "opaque" refers to a state that numerous microbubbles exist in vitreous silica and the vitreous silica appears opaque. The opaque vitreous silica layer 13 decreases the difference in thermal expansion coefficient between the crucible body 11 made of mullite material and the transparent vitreous silica layer 12, and functions to prevent cracks or detachment of the transparent vitreous silica layer 12. Therefore, the thickness of the opaque vitreous silica layer 13 can be sufficiently small as long as the opaque vitreous silica layer can exhibit such function. For example, the thickness of the opaque vitreous silica layer 13 is preferred to be the same as or smaller than that of the transparent vitreous silica layer 12. Furthermore, the opaque vitreous silica layer 13 may be thicker than the transparent vitreous silica layer 12, but is required to be thinner than the crucible body 11, and the thickness of the opaque vitreous silica layer 13 is preferred to be ½ or less of the thickness of the crucible body 11.

The bubble content rate of the opaque vitreous silica layer 13 is preferred to be 0.6% or more, and the average diameter of the bubbles is preferred to be 100 μm or less. When the bubble content rate of the opaque vitreous silica layer 13 is less than 0.6%, the opaque vitreous silica layer 13 cannot exhibit its function. The bubble content rate of the opaque vitreous silica layer 13 can be determined from the specific gravity. An opaque vitreous silica piece having a unit volume (1 cm$^3$) is cut out from the crucible. When the mass is A, and the specific gravity for vitreous silica not containing bubbles is assumed to be B=2.21 g/cm$^3$, the bubble content rate is P (%)=(1−A/B)*100. The measurement principle of the specific gravity of vitreous silica complies with the Archimedes method. An example of the testing method in JIS (Japanese Industrial Standards) is JIS Z8807.

Next, the method of manufacturing the composite crucible 10 will be explained in detail.

Figure 4:
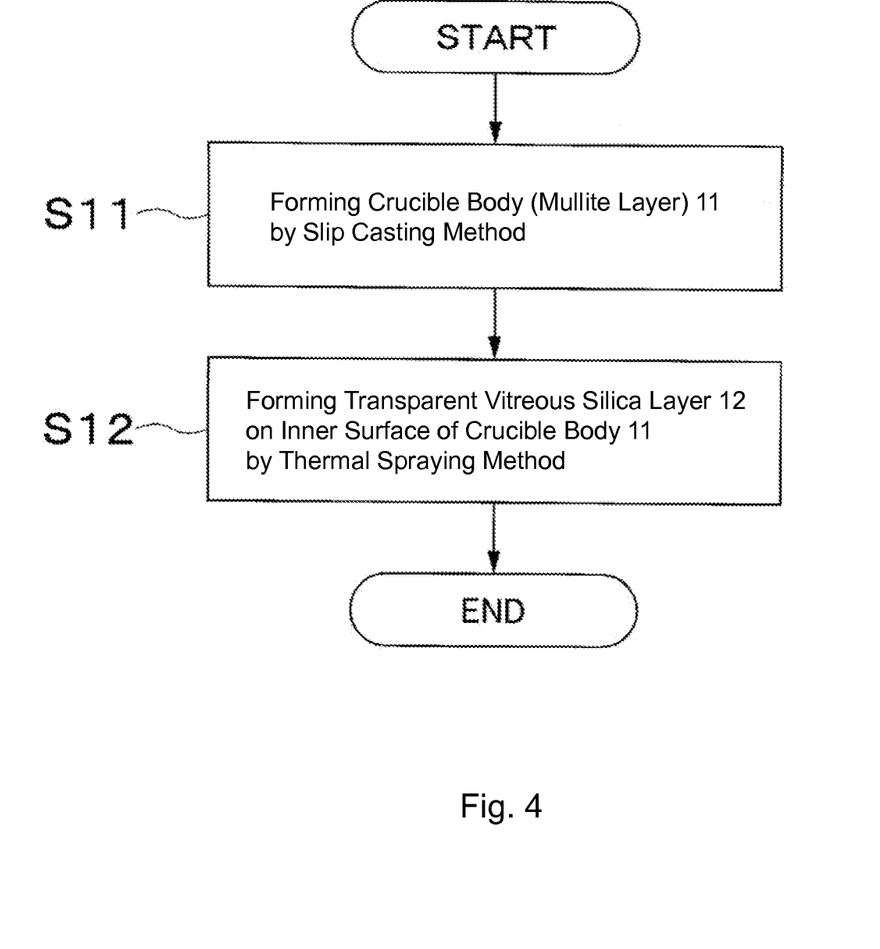
FIG. 4 is a flowchart for schematically explaining the first method of manufacturing the composite crucible.

The composite crucible 10 can be manufactured by several methods. The first method is, as shown in FIG. 4, a method of forming a crucible body 11 by the slip casting method (Step S11), and forming a transparent vitreous silica layer 12 on the inner surface by the thermal spraying method (Step S12). The slip casting method is well known as a method of forming a ceramic sintered body. Usually, a mold made of a material having good water absorbability such as plaster is used. Slurry (suspension of ceramic powder, also referred to as "slip") is injected into a cavity in the mold, and water in the slurry is absorbed to solidify the slurry. The obtained molded body is subjected to a degreasing process, and thereafter fired to obtain the final product. The method is, in general, appropriate for manufacturing a molded body having a complex shape, but takes long time to manufacture a molded body having a large wall thickness. There is also known the compression molding technique in which the slip casting molding method is carried out while pressure is applied to slurry. According to the slip casting compression molding method, slurry is forcedly dewatered, and thus a molded body having a relatively thick wall can be manufactured.

When the crucible body 11 which is the basic structure of the composite crucible 10 is molded by use of the slip casting method, slurry is first prepared by dispersing, in water, alumina powder and silica powder (material for mullite) in a certain ratio, and thereafter the slurry is supplied into a mold and dewatered to obtain a molded body whose main component is alumina and silica. In the present embodiment, it is preferred that the mold is mounted to a rotating axis, and is rotated to forcedly dewater the slurry. Next, the molded body solidified by the dewatering is dried for a certain period, and subjected to a degreasing process, and thereafter fired at 1400 deg. C., to obtain the crucible body 11 made of mullite material.

Next, the transparent vitreous silica layer 12 is formed on the inner surface of the crucible body 11 by the thermal spraying method. Here, the "thermal spraying" is a kind of a coating technique of forming a film by melting or softening coating material by heating ("thermal"), colliding the material in an accelerated and particulate state with the surface of an object to be coated ("spraying") to solidify and deposit the flattened particulate material. A technique to form a film by spraying particles in an unmelted state at high speed is included as a kind of the thermal spraying.

The transparent vitreous silica layer 12 is preferred to be manufactured by forming a vitreous silica thermal-sprayed film on a substrate (the inner surface of the crucible body) by use of the plasma thermal spraying method, and thereafter, irradiating the surface of the thermal-sprayed film with plasma jet not containing the thermal-spraying material, to fuse the surface of the vitreous silica thermal-sprayed film to enhance the smoothness.

The plasma thermal spraying method is preferred to be carried out by fusing, by plasma jet, the surface of the substrate or the already-formed thermal-sprayed film, to form a film. In such a way, it is possible to obtain a vitreous silica thermal-sprayed film which strongly adheres. Alternatively, the thermal-sprayed material particles are fused during thermal spraying, and after they have collided with the substrate surface they are further fused by plasma jet to enhance the adhesion. In this case, the fused particles are united, and thus it is easy to finally obtain a smooth thermal-sprayed film having a surface roughness of less than 5 μm. In order to finally obtain the smooth thermal-sprayed film having a surface roughness of less than 5 μm, the thermal spraying distance in the plasma thermal spraying is preferred to be as short as less than 60 mm, in particular 50 mm to 20 mm.

On the other hand, when the reduced pressure plasma thermal spraying method is used, the distance between the substrate and the thermal spraying gun can be 60 mm or more because of the elongated shape of the plasma jet, to fuse the surface of the vitreous silica substrate and to finally obtain a smooth vitreous silica thermal-sprayed film of the present invention. Furthermore, when a multi-torch plasma thermal spraying apparatus (Japanese published examined application Hei6-22719, "Yosha Gijutsu" (thermal spraying technique), Vol. 11, No. 1, p. 1 to 8 (1991)) which is a kind of a plasma thermal spraying apparatus is used for film forming by the laminar plasma jet, the distance can be 60 to 140 mm to finally obtain a smooth vitreous silica thermal-sprayed film of the present invention. In the multi-torch plasma thermal spraying apparatus, laminar flame plasma having a length of several hundred mm is obtained under the conditions where the gas flow rate is small (normally the length is about 50 mm in a turbulent flow state), and therefore, even when the distance is 60 mm or more, it is possible to finally form a vitreous silica thermal-sprayed film of the present invention.

Plasma gas in the plasma thermal spraying is preferred to be a mixed gas of an inert gas and hydrogen. When hydrogen is added to the inert gas, the amount of hydrogen is preferred to be 10 to 50%, in particular 10 to 30%. Examples of the inert gas are helium, neon, argon, krypton, nitrogen, and the like, but industrially it is preferred to use argon or nitrogen. When hydrogen is added, it becomes easier to obtain a thermal-sprayed film having high surface smoothness and not containing bubbles.

Plasma jet is a gas flow of plasma generated by gas discharge of the above-mentioned gas and having a high temperature of several thousand to tens of thousand deg. C. To obtain such plasma jet, it is preferred that the power is supplied from a DC power supply, and the power is, for example, 25 to 35 kW or more.

When plasma jet not containing thermal spraying material is radiated to the surface of the vitreous silica thermal-sprayed film formed by the above-mentioned plasma thermal spraying method, the surface of the vitreous silica thermal-sprayed film is sufficiently fused to achieve high smoothness. When the moving speed of the radiation of the plasma jet after the formation of the thermal-sprayed film is increased or the power of the radiation is reduced, only the substances attached to the surface of the thermal-sprayed film is fused and removed, and the surface roughness is maintained as it is. However, when the surface of the vitreous silica thermal-sprayed film is sufficiently fused so that the fusing is not limited to the removal of the substances attached to the surface, the surface roughness can be improved up to the roughness Ra of less than 5 μm.

The radiation conditions of the plasma jet can be basically the same, in terms of the thermal spraying distance, the supplied power, the plasma gas, as those in depositing the thermal-sprayed film by supplying the thermal spraying material. Furthermore, the number of radiation of the plasma jet can be one time as long as the surface of the thermal-sprayed film is fused, but the radiation can be repeated plural times in order to achieve particularly high surface smoothness.

The material for thermal spraying can be quartz crystal powder, natural vitreous silica powder, high-purity synthetic vitreous silica powder, or the like when powder material is used. The size of the thermal spraying powder is in particular preferred to be an average diameter of 20 μm or more and 100 μm or less. When the average diameter is less than 20 μm, the fluidity of the powder material is insufficient, and thus it is not possible to uniformly supply the material into the plasma, and thus the obtained thermal-sprayed film tends be ununiformly formed. On the other hand, when the average diameter is over 100 μm, the fusing of the thermal spraying powder tends to be insufficient, and thus the surface of the vitreous silica thermal-sprayed film becomes rough, and is difficult to be flattened by subsequent plasma jet thermal spraying.

In order to form a high-purity vitreous silica thermal-sprayed film, it is preferred to use synthetic vitreous silica powder synthesized by thermolysis of high-purity silicon tetrachloride with oxyhydrogen flame. When the synthetic vitreous silica powder synthesized by thermolysis of high-purity silicon tetrachloride with oxyhydrogen flame is used as the material, it is possible to form a vitreous silica thermal-sprayed film having a purity of 99.9999%, and thus appropriate for a crucible for pulling a silicon single crystal where high purity is required.

As shown in FIG. 3, an opaque vitreous silica layer 13 incorporating bubbles may be formed between the transparent vitreous silica layer 12 which is a smooth vitreous silica thermal-sprayed film and the crucible body 11. In the plasma thermal spraying method, the bubbles of the opaque vitreous silica layer 13 can be increased by decreasing the amount of heat, per unit area, supplied to the substrate surface by plasma jet. When the amount of heat, per unit area, supplied to the substrate surface by plasma jet is decreased, the fusing of the thermal spraying particles becomes insufficient, and thus bubbles (spaces) are generated within the vitreous silica thermal-sprayed film to form the opaque vitreous silica thermal-sprayed film. In order to decrease the amount of heat, per unit area, supplied to the substrate surface by plasma jet, there are several methods, such as that the thermal spraying power is decreased, the thermal spraying distance is increased, or the moving speed of the thermal spraying gas is increased. The thermal spraying conditions for the opaque vitreous silica thermal-sprayed layer including bubbles are, for example, that the thermal spraying distance is 40 to 60 mm, argon gas not including hydrogen gas in the plasma gas is used, or the like. When hydrogen is added to argon gas, the temperature of the plasma jet is increased, and bubbles are more difficult to be formed.

As the method of forming the opaque vitreous silica layer 13 incorporating bubbles, apart from the above-mentioned method of changing the amount of heat per unit time supplied to the substrate, there is also a method of using, as the thermal spraying powder, powder obtained by mixing fine particles of silicon nitride in the thermal spraying material powder, and forming the material by generating decomposition gas during the thermal spraying. When such material is used, it is possible to incorporate bubbles in the thermal-sprayed film without changing the thermal spraying conditions.

Here, when the fine particles of silicon nitride are added to the silica powder which is the thermal spraying material, the average diameter of the fine particles of silicon nitride is preferred to be 0.5 to 5 μm, and the addition amount is preferred to be 0.03 to 3 wt %. When the average diameter of the fine particles of silicon nitride is less than 0.5 μm, it becomes difficult to uniformly mix the fine particles of silicon nitride in silica powder. When the average diameter of the fine particles of silicon nitride is over 5 μm, the diameter of the bubbles becomes 500 μm or more, and the mechanical strength of the thermal-sprayed film is weakened. When the addition amount of the fine particles of silicon nitride is less than 0.03 wt %, the formation of bubbles is insufficient, and when the addition amount is over 3 wt %, bubbles are combined to form a larger bubble, and the dispersion of the bubbles becomes ununiform, and thus it is not preferable.

As explained above, the composite crucible of the present embodiment can be formed by forming the transparent vitreous silica layer 12 by the thermal spraying method on the inner surface of the crucible body 11 formed by the slip casting method.

Figure 5:
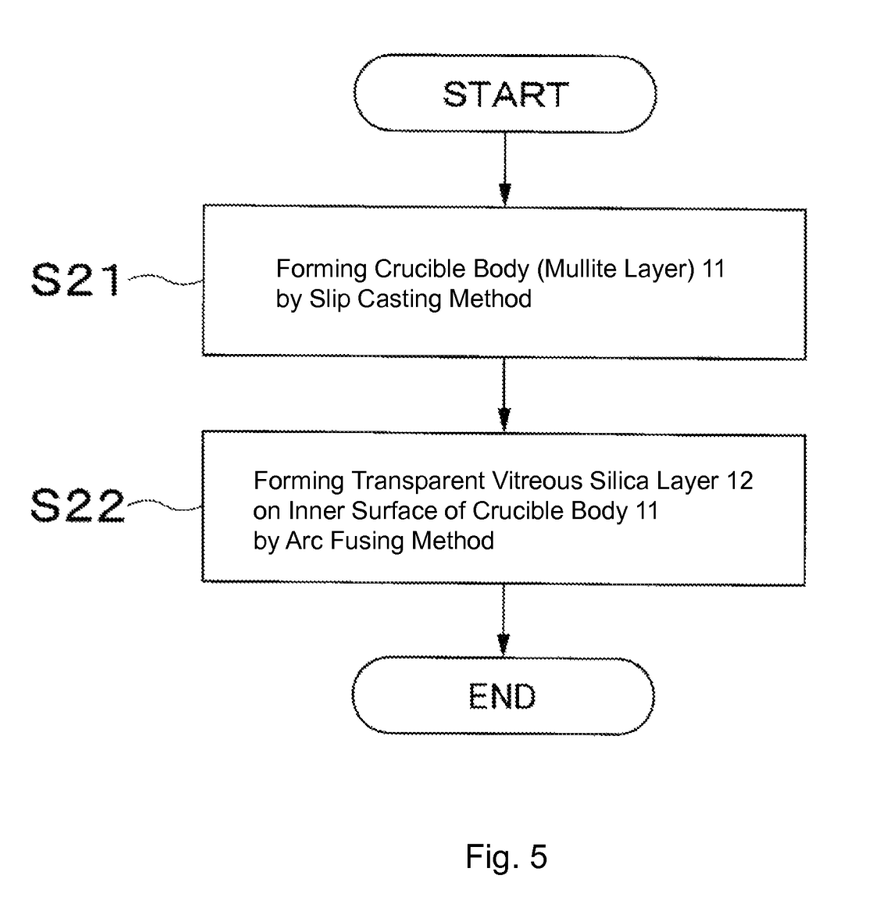
FIG. 5 is a flowchart for schematically explaining the second method of manufacturing the composite crucible.

The second method is, as shown in FIG. 5, a method of forming a crucible body 11 made of mullite material by the above-mentioned slip casting method (Step S21), and forming the transparent vitreous silica layer 12 on the inner surface of the crucible body 11 by the arc fusing method (Step S22). The method of forming the crucible body 11 by the slip casting method is the same as explained above. Examples of the method of forming the transparent vitreous silica layer 12 by the arc fusing method include the reduced pressure method and the spraying method.

(Reduced Pressure Method)

In forming the transparent vitreous silica layer 12, the crucible body made of mullite material is set in a rotatable carbon mold, and supplying silica powder along the inner wall surface of the crucible body 11 while rotating the crucible body 11, to form a silica powder layer having a substantially uniform thickness. At this stage, a centrifugal force is applied to the silica powder to keep the position at the inner surface of the crucible body. Thereafter, the silica powder is arc fused under vacuum suction to form the transparent vitreous silica layer 12. The carbon mold includes ventilation holes for the vacuum suction, and gas in the silica powder layer is moved toward the outer surface side of the crucible by the suction through the ventilation holes.

Furthermore, arc electrodes are provided above the central axis (rotation axis) of the carbon mold, and they can be moved up and down. The arc electrodes are placed above in a rest position before arc fusing, but the arc electrodes are moved down to the inside of the crucible during heating, to arc fuse the silica powder by the arc electrodes under vacuum suction to form a transparent vitreous silica layer 12. When the transparent vitreous silica layer 12 is formed by the reduced pressure method, the crucible body is preferred to be formed to be porous so that pressure reduction from the outer surface side of crucible body 11 is enabled. The porosity of the crucible body 11 is, for example, 1 to 30%. As the porosity is smaller, the effect of the pressure reduction from the outer surface side of the crucible during arc fusing is more difficult to reach the inner surface side of the crucible, but the strength of the crucible body 11 becomes higher. The porosity can be adjusted by changing the particle diameter of material alumina powder and silica powder. The porosity is, for example, 1, 2, 5, 10, 15, 20, 25, 30%, and it can be in the range between two values of the values exemplified here.

In this case, it is also preferred that the electrodes are moved sideward with respect to the mold center line at the beginning of or during arc fusing, and the arc fusing is carried out at an eccentric position. The carbon mold is rotating during arc fusing, and thus even when the arc fusing is carried out with arc electrodes at the eccentric position, the material powder is arc fused intermittently when the material powder is close to the arc electrodes, and thus it is possible to uniformly heat and fuse the entire rim end. More specifically, for example, when a vitreous silica crucible having an opening diameter of 28 to 32 inches and an average wall thickness of 11 to 16 mm is manufactured and when the temperature of the crucible inner surface is 1600 to 2500 degrees C. and the total arc fusing time is 20 to 40 minutes, it is preferred that the arc electrodes are moved toward the rim, and local heating is carried out for 10 to 20 minutes from the beginning of arc fusing, and subsequently, overall heating is carried out for 10 to 20 minutes.

Furthermore, it is also possible to form an opaque vitreous silica layer 13 between the crucible body 11 and the transparent vitreous silica layer 12 by adjusting time or pressure of vacuum suction. It is possible to prevent cracks or detachment of the transparent vitreous silica layer 12 by forming the opaque vitreous silica layer 13 as shown in FIG. 3.

(Spraying Method)

Furthermore, the transparent vitreous silica layer 12 can also be formed by the spraying method. The spraying method is a method of forming the transparent vitreous silica layer 12 by spraying silica powder toward the inner surface of the crucible body 11 while performing arc discharge toward the inner surface of the crucible body 11. In this method, when silica powder is attached to the inner surface of the crucible body 11 heated by arc discharge, the silica powder is immediately fused to form a vitreous silica layer. According to this method, pressure reduction from the outer surface side of the crucible body 11 is not necessary, and thus the crucible body 11 does not need to be porous, and thus the strength of the crucible body 11 can be enhanced.

As explained above, the composite crucible 10 of the present embodiment can be formed by forming the transparent vitreous silica layer 12 by the arc fusing method on the inner surface of the crucible body 11 formed by the slip casting method.

Figure 6:
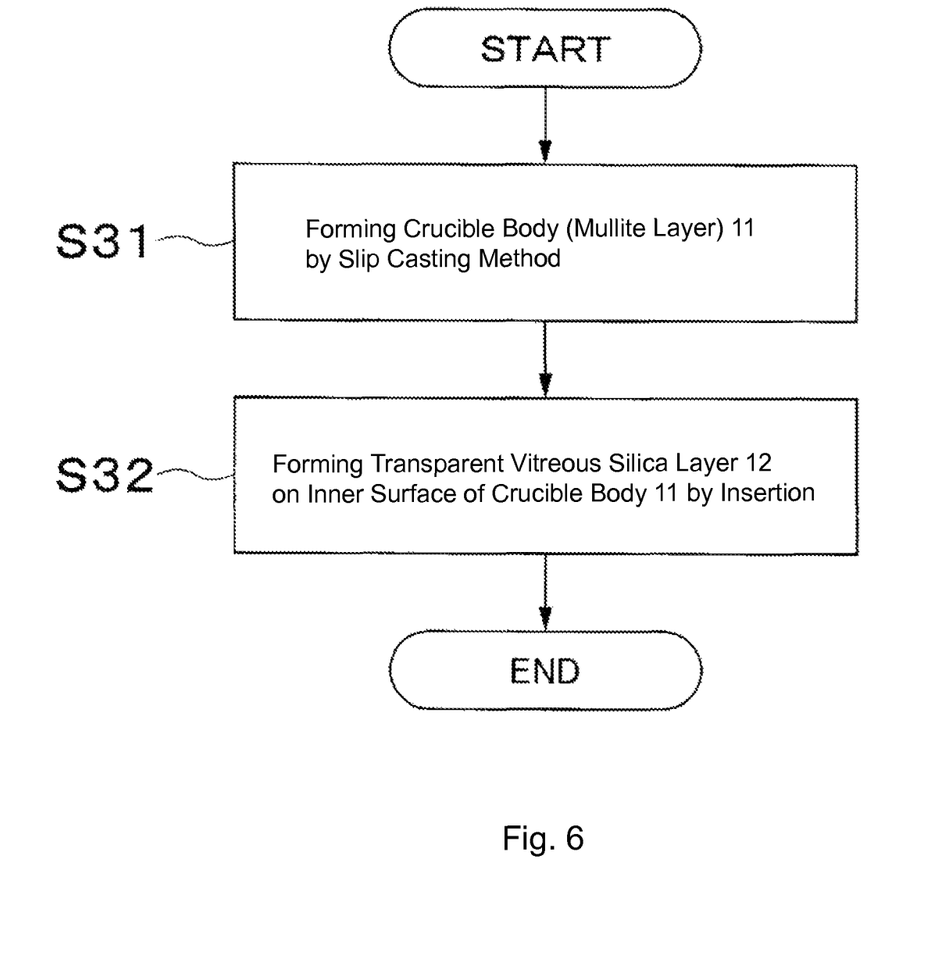
FIG. 6 is a flowchart for schematically explaining the third method of manufacturing the composite crucible.

The third method is, as shown in FIG. 6, a method of forming a crucible body 11 made of mullite material by the above-mentioned slip casting method (Step S31), and inserting a transparent vitreous silica molded body, which will be the transparent vitreous silica layer 12, onto the inner surface of the crucible body 11 (Step S 32). The method of forming the crucible body 11 by the slip casting method is the same as explained above.

In the third method, the transparent vitreous silica molded body is prepared separately from the crucible body 11, and the transparent vitreous silica molded body is inserted into the inside of the crucible body, and they are heated to 1500 decreases C or more to unite the transparent vitreous silica molded body with crucible body 11. At this stage, it is preferred that the crucible body 11 is mounted in a mold having ventilation holes, and they are united while the crucible body is subjected to vacuum suction from the outer side to enhance the adhesion therebetween. Furthermore, it is also preferred that the inner surface of the crucible body 11 is roughened by sandblast or etching, followed by washing by hydrofluoric acid or the like before the two crucibles are combined, and thereafter, the vitreous silica molded body is inserted. In this way, the bonding therebetween is further enhanced.

Alternatively, instead of inserting a vitreous silica molded body only having the transparent vitreous silica layer 12, it is also possible to insert, into the crucible body 11, a two-layered vitreous silica molded body having an opaque vitreous silica layer 13 on the outer side, and a transparent vitreous silica layer 12 on the inner side, to manufacture a composite crucible 20 having the opaque vitreous silica layer 13 as shown in FIG. 3 as the intermediate layer.

Figure 7:
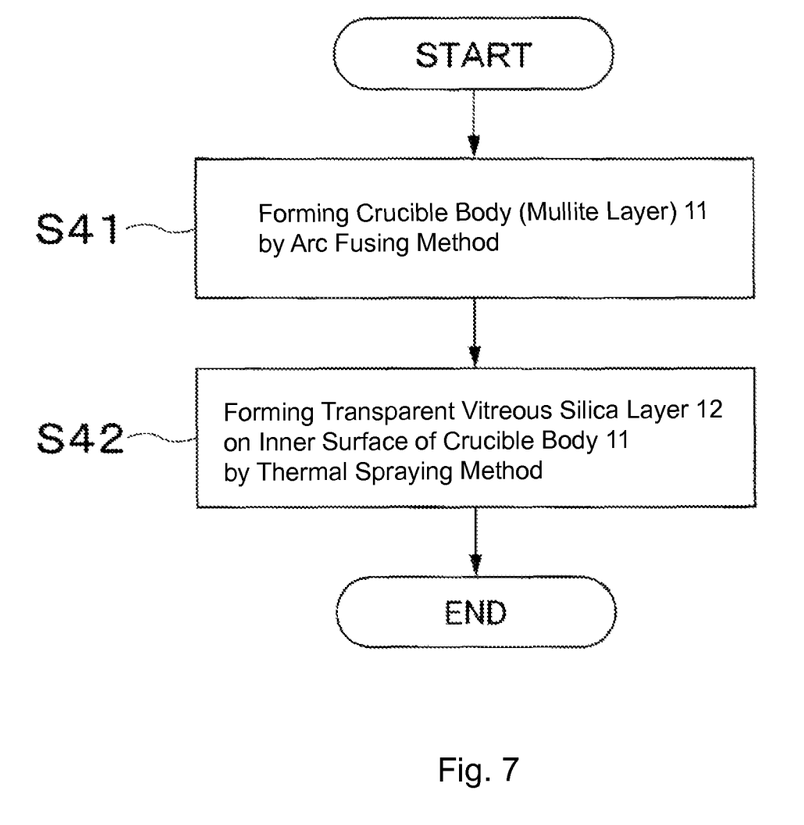
FIG. 7 is a flowchart for schematically explaining the fourth method of manufacturing the composite crucible.

The fourth method is, as shown in FIG. 7, a method of forming, by the arc fusing method, the crucible body 11 made of mullite material by use of material powder obtained by mixing alumina powder and silica powder in a predetermined ratio (Step S41), and forming, by the thermal spraying method, the transparent vitreous silica layer 12 on the inner surface of the crucible body 11 (Step S42). In this case, the crucible body 11 made of mullite material can be formed by supplying the above-mentioned mullite material powder into the carbon mold in a predetermined thickness, and arc fusing the material powder under vacuum suction. Then, the transparent vitreous silica layer 12 is formed on the inner surface of the crucible body 11 as explained in the first manufacturing method, to manufacture the composite crucible 10. As in the first method, the composite crucible 20 as shown in FIG. 3 can be manufactured by sequentially forming, on the inner surface of the crucible body 11, the opaque vitreous silica layer 13 and the transparent vitreous silica layer 12 by the thermal spraying method.

Furthermore, in the fourth method, plural kinds of material powder whose mixing ratio is different from one another are prepared, and they are supplied into the carbon mold in the descending order of the ratio of alumina powder to obtain a multi-layer structure of the material powder. In this way, the crucible body 11 having alumina concentration gradient in the thickness direction as shown in FIG. 2 can be formed. According to this structure, the composition on the inner surface side of the crucible body 11 is close to that of silica, and thus the bonding of the crucible body 11 to the transparent vitreous silica layer 12 can be enhanced, and detachment due to difference in thermal expansion coefficient can be certainly prevented.

Figure 8:
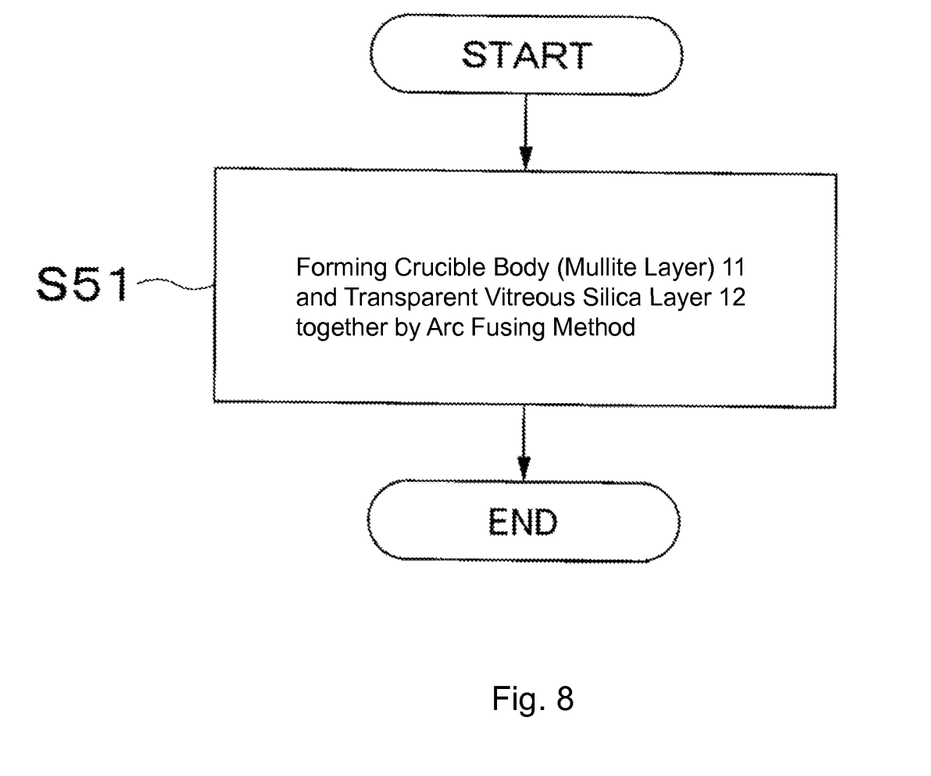
FIG. 8 is a flowchart for schematically explaining the fifth method of manufacturing the composite crucible.

The fifth method is, as shown in FIG. 8, a method of forming, by the arc fusing method, the crucible body 11 made of mullite material by use of material powder obtained by mixing alumina powder and silica powder in a predetermined ratio, and forming the transparent vitreous silica layer 12 together with the crucible body 11 (Step S41). In this case, the crucible body 11 and the transparent vitreous silica layer 12 can be formed simultaneously by supplying material powder for the crucible body 11 into the carbon mold in a predetermined thickness, supplying material powder for the transparent vitreous silica layer 12 thereon, and arc fusing the material powder under vacuum suction. After cooling, the crucible is taken out of the mold, and subjected to rim-cutting. Furthermore, the opaque vitreous silica layer 13 between the crucible body 11 and the transparent vitreous silica layer 12 can be formed by adjusting time or pressure of vacuum suction. Furthermore, the transparent vitreous silica layer 12 may be formed, by the arc fusing method, on the inner surface of the crucible body formed by the slip casting method. Furthermore, as in the fourth method, plural kinds of material powder for the crucible body may be supplied into the carbon mold in the descending order of the ratio of alumina powder to obtain a multi-layer structure of the material powder.

Next, the method of manufacturing a silicon single crystal by the CZ method by use of the above-mentioned composite crucible will be explained.

Figure 9:
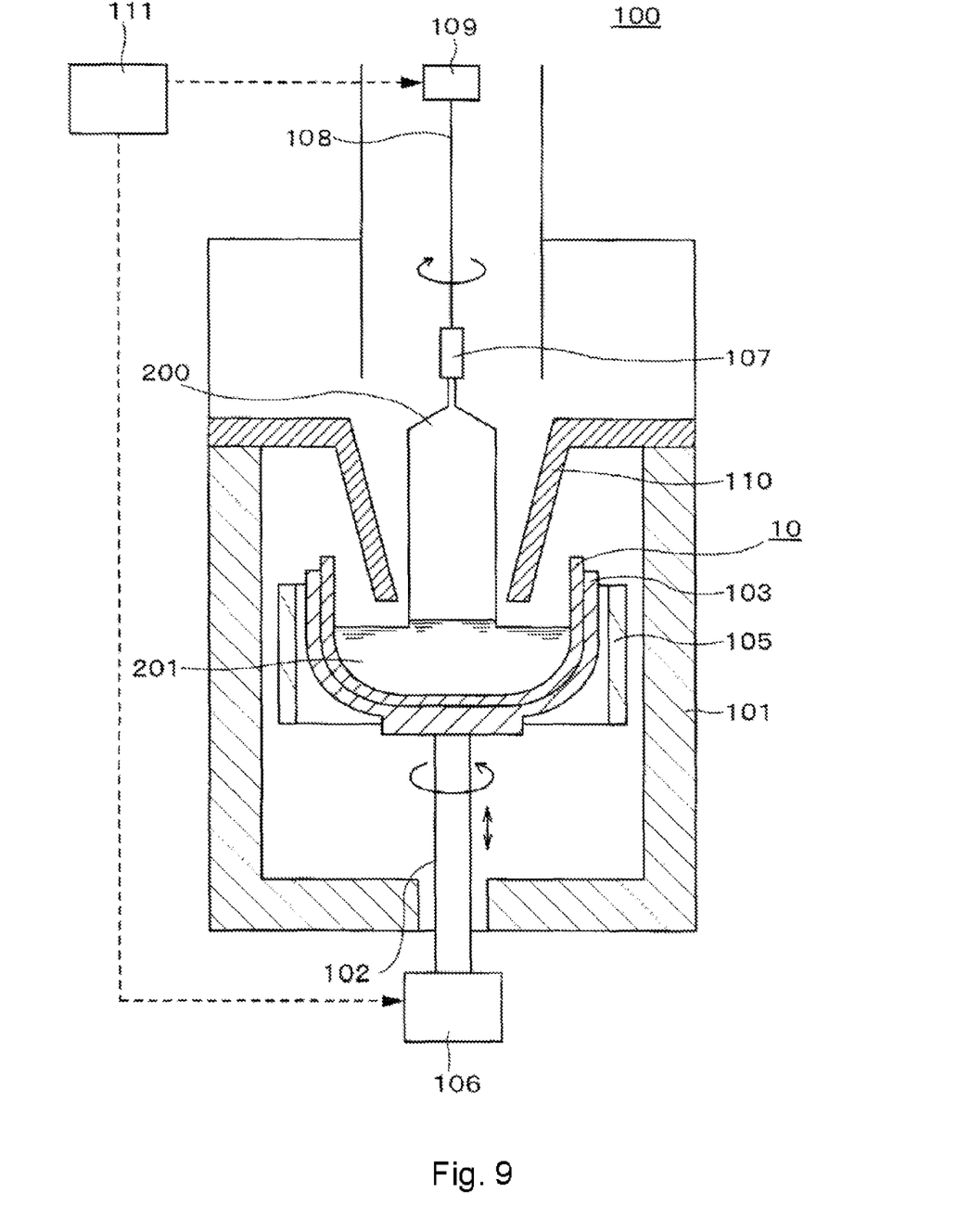
FIG. 9 is a schematic diagram showing the configuration of a silicon single crystal pulling apparatus including the composite crucible.

FIG. 9 is a sectional view schematically showing the structure of the silicon single crystal pulling apparatus.

As shown in FIG. 9, the silicon single crystal pulling apparatus 100 includes a chamber 101, a conductive supporting axis 102 vertically provided penetrating the bottom center of the chamber 101, a graphite susceptor 103 fixed at the upper end of the supporting axis 102, a composite crucible 10 (or a composite crucible 20) accommodated in the graphite susceptor 103, a heater 105 provided around the graphite susceptor 103, a supporting axis driver 106 for moving up and down and rotating the supporting axis 102, a seed chuck 107 for retaining a seed crystal, a pulling wire 108 for hanging the seed chuck 107, a wire winder 109 for winding the pulling wire 108, a thermal insulation member 110 for preventing heating of a silicon single crystal 200 by the radiation heat from the heater 105 and the composite crucible 10 and suppressing the temperature change of silicon melt 201, and a controller 111 for controlling these components.

In manufacturing a silicon single crystal by the silicon single crystal pulling apparatus 100, first, appropriate amount of polysilicon blocks which are raw material for a silicon single crystal are supplied into the composite crucible 10 mounted in the graphite susceptor 103. Next, the chamber 101 is made under reduced pressure and Ar gas atmosphere, and thereafter, the composite crucible 10 in the chamber 101 is heated by the heater 105 to melt polysilicon in the composite crucible 10. After melting polysilicon, temperature adjustment is carried out until the temperature of silicon melt 201 becomes stable at about 1500 degrees C. Then, a seed crystal is contacted to the silicon melt 201, and pulling of a silicon single crystal 200 is started.

In pulling the silicon single crystal 200 by the CZ method, while the supporting axis 102 and the pulling wire 108 are rotated to directions opposite to each other, the seed crystal is gradually pulled to grow a silicon single crystal 200 at the lower end of the seed crystal. In more detail, first, seed narrowing (necking) is carried out by the Dash method to obtain a dislocation-free single crystal. Then, a shoulder portion is grown to obtain a silicon single crystal having a necessary diameter, and after the silicon single crystal becomes a desired diameter, a body portion having a constant diameter is grown. After the body portion is grown to a predetermined length, tale narrowing (formation of a tale portion) is carried out to separate a dislocation-free single crystal from the silicon melt 201.

The composite crucible 10 (or 20) used in the present invention has very high temperature durability, and thus is very advantageous in the above-mentioned multiple pulling or the continuous CZ method (CCZ method) where silicon material is continuously supplied into a crucible to pull a silicon single crystal. The silicon single crystal ingot separated from silicon melt 201 is cooled under predetermined conditions, and a silicon wafer cut off from the silicon single crystal ingot is used as a substrate material for a solar cell or a semiconductor device.

The present invention is not in particular limited, and can be modified as long as the modification does not depart from the spirits of the present invention, and the modification is incorporated in the scope of the present invention.

Example

Samples A1 to A3 of the composite crucible shown in FIG. 1 were prepared. The crucible had a diameter of 16 inches (opening diameter of about 400 mm), a height of the 250 mm. The wall thickness of the crucible was 6.5 mm at the straight body portion, 8 mm at the curved portion, and 5 mm at the bottom portion. The thicknesses of the transparent vitreous silica layer and the crucible body at the sidewall portion were 0.5 mm and 6 mm, respectively. In the sample A1, the crucible body was formed by the slip casting method, and the transparent vitreous silica layer was formed by the plasma thermal spraying method. In the sample A2, the crucible body was formed by the slip casting method, and the transparent vitreous silica layer was formed by the spraying method of the arc fusing method. In the sample A3, the crucible body and the transparent vitreous silica layer were formed by the reduced pressure method of the arc fusing method.

Next, the crucible samples A1 to A3 were heated for a long time in a furnace, and thereafter, they were taken out of the furnace, and the deformation state of the crucible was visually observed. The heating temperature was 1500 degrees C., and the heating time was 120 hours. The results are shown in Table 1.

TABLE 1

| Ex. Crucible Sample | Thickness at Straight Body Portion (mm) | | State after Heating |
|---|---|---|---|
| | Crucible Body | Transparent Vitreous Silica Layer | |
| A1 | 6 | 0.5 | No Deformation |
| A2 | 6 | 0.5 | No Deformation |
| A3 | 6 | 0.5 | No Deformation |

As shown in Table 1, in the crucible samples A1 to A3 having a crucible body having a thickness of 6 mm, there were no visually observable deformation or buckling in 120-hour heat resistance test.

Comparative Example 1

A sample B1 of a common vitreous silica crucible having a transparent vitreous silica layer as the inner layer and an opaque vitreous silica layer as the outer layer was prepared. The crucible had a diameter of 16 inches (opening diameter of about 400 mm), a height of the 250 mm. The wall thickness of the crucible was 6.5 mm at the straight body portion, 8 mm at the curved portion, and 5 mm at the bottom portion. The thicknesses of the transparent vitreous silica layer and the opaque vitreous silica layer at the sidewall portion were 0.5 mm and 6 mm, respectively. The sample B1 was formed by the reduced pressure method of the arc fusing method. Then, the crucible sample B1 was subjected to long-time heating in a furnace, and thereafter, the sample was taken out of the furnace, and the deformation state was visually observed. As in the above-mentioned Example, the heating temperature was 1500 degrees C., and the heating time was 120 hours. The result is shown in Table 2.

TABLE 2

| Comp. Ex. Crucible Sample | Thickness at Straight Body Portion (mm) | | | State after Heating |
|---|---|---|---|---|
| | Opaque Vitreous Silica Layer | Al-Containing Layer | Transparent Vitreous Silica Layer | |
| B1 | 6 | — | 0.5 | Inward Sagging and Buckling |
| B2 | 6 | 0.5 | 0.5 | Inward Sagging |

As shown in Table 2, in the sample B1 which is a common vitreous silica crucible, inward sagging and buckling occurred in the straight body portion after long-time heating, and the substantial drop of the circularity was observed.

Comparative Example 2

There was prepared a sample B2 of a vitreous silica crucible (vitreous silica crucible reinforced by Al) having the same configuration as the above-mentioned crucible sample B1 except that an Al-containing layer was formed in the region near the outer surface of the crucible. The thickness of the Al-containing layer was 0.5 mm at the straight body portion, and the Al concentration was 100 ppm. The Al-containing layer was a layer formed in a region near the outer surface of the opaque vitreous silica layer, and was a part of the opaque vitreous silica layer. The sample B2 was formed by the reduced pressure method of the arc fusing method. Then, the crucible sample B2 was subjected to long-time heating in a furnace, and thereafter, the sample was taken out of the furnace, and the deformation state was visually observed. As in the above-mentioned Example, the heating temperature was 1500 degrees C., and the heating time was 120 hours. The result is shown in Table 2.

As shown in Table 1, in the sample B2 of a vitreous silica crucible having the Al-containing layer, buckling did not occur, but inward sagging occurred at the straight body portion.

EXPLANATION OF REFERENCE SYMBOL

10 Composite Crucible
10A Straight Body Portion
10B Bottom Portion
10C Curved portion
11 Crucible Body
12 Transparent Vitreous Silica Layer
100 Silicon Single Crystal Pulling Apparatus
101 Chamber
102 Supporting Axis
103 Graphite Susceptor
105 Heater
106 Supporting Axis Driver
107 Seed Chuck
108 Wire
109 Wire Winder
110 Thermal Insulation Member
111 Control Apparatus
200 Silicon Single Crystal
201 Silicon Melt

The invention claimed is:

1. A composite crucible for supporting silicon melt and having a straight body portion and a bottom portion, comprising:
    a mullite material layer comprising mullite material whose main component is alumina and silica, said mullite material comprising mullite in an amount of at least 50%;
    a transparent vitreous silica layer formed on an inner surface side of the mullite material layer; and
    an opaque vitreous silica layer containing numerous microbubbles and provided between and in contact with the mullite material layer and the transparent vitreous silica layer;
    wherein the thickness of the mullite material layer is between 5 mm and 20 mm, the thickness of the transparent vitreous silica layer is between 0.5 mm and 2 mm, and
    wherein the thickness of the opaque vitreous silica layer is the same as or smaller than that of the transparent vitreous silica layer.

2. The composite crucible of claim 1, wherein an aluminium concentration in the mullite material layer is lowering from an outer surface side to an inner surface side of the mullite material layer.

* * * * *